US010348291B2

(12) United States Patent
Sasaki (10) Patent No.: US 10,348,291 B2
(45) Date of Patent: Jul. 9, 2019

(54) RESISTOR ARRAY, OUTPUT BUFFER, AND MANUFACTURING METHOD FOR SEMICONDUCTOR DEVICE

(71) Applicant: LAPIS Semiconductor Co., Ltd., Yokohama (JP)

(72) Inventor: Seiichiro Sasaki, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 12 days.

(21) Appl. No.: 15/474,168

(22) Filed: Mar. 30, 2017

(65) Prior Publication Data

US 2017/0288658 A1    Oct. 5, 2017

(30) Foreign Application Priority Data

Mar. 31, 2016 (JP) ................ 2016-070996

(51) Int. Cl.
| | |
|---|---|
| *H03K 5/00* | (2006.01) |
| *H03K 17/16* | (2006.01) |
| *H01L 49/02* | (2006.01) |
| *H03K 19/00* | (2006.01) |
| *H03F 1/56* | (2006.01) |
| *H03F 3/21* | (2006.01) |

(52) U.S. Cl.
CPC ............ *H03K 17/16* (2013.01); *H01L 28/20* (2013.01); *H03F 1/56* (2013.01); *H03F 3/211* (2013.01); *H03K 19/0005* (2013.01)

(58) Field of Classification Search
None
See application file for complete search history.

(56) References Cited

U.S. PATENT DOCUMENTS

| | | | |
|---|---|---|---|
| 8,166,222 B2 * | 4/2012 | Garlapati | G06F 13/4072 326/62 |
| 9,413,341 B1 * | 8/2016 | Ho | H03B 5/364 |
| 9,756,699 B2 * | 9/2017 | Brooks | H03K 3/0231 |
| 9,847,753 B2 * | 12/2017 | Ho | H03B 5/364 |
| 9,886,047 B2 * | 2/2018 | Yoshii | G05F 1/575 |
| 2006/0202710 A1 * | 9/2006 | Lin | H04L 25/0298 326/30 |
| 2007/0285154 A1 * | 12/2007 | Darabi | H03B 21/01 327/551 |
| 2016/0320783 A1 * | 11/2016 | Yoshii | G05F 1/575 |
| 2017/0288658 A1 * | 10/2017 | Sasaki | H01L 28/20 |
| 2017/0331489 A1 * | 11/2017 | Dempsey | H01L 23/34 |
| 2018/0120883 A1 * | 5/2018 | Yoshii | G05F 1/575 |

FOREIGN PATENT DOCUMENTS

JP    2009-164718 A    7/2009

* cited by examiner

*Primary Examiner* — Lincoln D Donovan
*Assistant Examiner* — Khareem E Almo
(74) *Attorney, Agent, or Firm* — Rabin & Berdo, P.C.

(57) ABSTRACT

A resistor array made of a semiconductor includes a plurality of resistor groups and a common line that electrically connects the M-th resistors of the plurality of resistor groups. Each resistor group includes first to M-th resistors connected in series, M being an integer of 2 or greater, and at least one short-circuit line, each short-circuiting at least one, but not all, of the M resistors.

12 Claims, 5 Drawing Sheets

| | SERIES RESISTOR PART R | | | | | | | | | | | | | | | | | | | | | | RESIST-ANCE RATE |
|---|---|---|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | |
| PT1 | A | A | A | A | A | A | A | A | A | A | A | A | A | A | A | A | A | A | A | A | A | A | 1.25 |
| PT2 | A | A | A | A | A | A | A | A | A | A | A | A | A | A | A | A | A | A | A | A | A | B | 1.24 |
| PT3 | A | A | A | A | A | A | A | A | A | A | A | A | A | A | A | A | A | A | A | A | B | B | 1.22 |
| PT4 | A | A | A | A | A | A | A | A | A | A | A | A | A | A | A | A | A | A | A | B | B | B | 1.21 |
| PT5 | A | A | A | A | A | A | A | A | A | A | A | A | A | A | A | A | A | A | B | B | B | B | 1.20 |
| ⋮ | | | | | | | | | | ⋮ | | | | | | | | | | | | | ⋮ |
| PT20 | A | A | A | B | B | B | B | B | B | B | B | B | B | B | B | B | B | B | B | B | B | B | 1.03 |
| PT21 | A | A | B | B | B | B | B | B | B | B | B | B | B | B | B | B | B | B | B | B | B | B | 1.02 |
| PT22 | A | B | B | B | B | B | B | B | B | B | B | B | B | B | B | B | B | B | B | B | B | B | 1.01 |
| PT23 | B | B | B | B | B | B | B | B | B | B | B | B | B | B | B | B | B | B | B | B | B | B | 1.00 |
| PT24 | B | B | B | B | B | B | B | B | B | B | B | B | B | B | B | B | B | B | B | B | B | C | 0.99 |
| PT25 | B | B | B | B | B | B | B | B | B | B | B | B | B | B | B | B | B | B | B | B | C | C | 0.97 |
| PT26 | B | B | B | B | B | B | B | B | B | B | B | B | B | B | B | B | B | B | B | C | C | C | 0.96 |
| ⋮ | | | | | | | | | | ⋮ | | | | | | | | | | | | | ⋮ |
| PT41 | B | B | B | B | B | C | C | C | C | C | C | C | C | C | C | C | C | C | C | C | C | C | 0.80 |
| PT42 | B | B | B | B | C | C | C | C | C | C | C | C | C | C | C | C | C | C | C | C | C | C | 0.79 |
| PT43 | B | B | B | C | C | C | C | C | C | C | C | C | C | C | C | C | C | C | C | C | C | C | 0.78 |
| PT44 | B | B | C | C | C | C | C | C | C | C | C | C | C | C | C | C | C | C | C | C | C | C | 0.77 |
| PT45 | B | C | C | C | C | C | C | C | C | C | C | C | C | C | C | C | C | C | C | C | C | C | 0.76 |
| PT46 | C | C | C | C | C | C | C | C | C | C | C | C | C | C | C | C | C | C | C | C | C | C | 0.75 |

A: RA SELECTION PATTERN
B: RB SELECTION PATTERN
C: RC SELECTION PATTERN

FIG. 5

RESISTOR ARRAY, OUTPUT BUFFER, AND MANUFACTURING METHOD FOR SEMICONDUCTOR DEVICE

BACKGROUND OF THE INVENTION

Technical Field

The present invention relates to a resistor array including a plurality of resistors, an output buffer having such a resistor array, and a manufacturing method for a semiconductor device.

Background Arts

In an electronic device including a semiconductor device, an output buffer is provided to compensate for signal attenuation on a transmission line that connects the electronic device to another electronic device so as to output a signal generated by the electronic device. The output terminal of this output buffer is connected to a resistor (will be referred to as an output resistor below) to prevent electrostatic breakdown and ensure impedance matching for the transmission line.

For such an output resistor, an output buffer circuit using a variable resistor is proposed (see Japanese Patent Application Laid-open Publication No. 2009-164718, for example). The variable resistor is constituted of a transfer gate of a MOS (Metal Oxide Semiconductor) transistor, and by controlling the gate voltage, the resistance of the pass gate can be changed.

SUMMARY OF THE INVENTION

However, in order to set the transfer gate to a desired resistance, it is necessary to dispose a circuit that generates a gate voltage corresponding to the resistance and supplies the gate voltage to the gate terminal of the transfer gate (such as a reference resistor, comparator, and output driver), which would increase the device size.

If the output resistor described above is a fixed resistor using polysilicon or the like, the resistance required to prevent electrostatic breakdown and ensure impedance matching for the transmission line is approximately 700 ohms or less, which is low, for example, and this results in a greater error rate of resistance caused by manufacturing variations.

In order to solve this problem, the present invention is aiming at providing a resistor array that can adjust the resistance to a desired value with a high degree of accuracy, an output buffer that includes this resistor array, and a manufacturing method for a semiconductor device in which the resistor array is formed.

According to an aspect of the invention, a resistor array made of a semiconductor includes a plurality of resistor groups, each including first to M-th resistors connected in series, M being an integer of 2 or greater, and at least one short-circuit line, each short-circuiting at least one, but not all, of the M resistors; and a common line that electrically connects the M-th resistors of the plurality of resistor groups.

According to an aspect of the invention, an output buffer for receiving an input signal and outputting an output signal through an external terminal, including an output resistor circuit including a plurality of resistor groups, each including first to M-th resistors connected in series, M being an integer of 2 or greater, and at least one short-circuit line, each short-circuiting at least one, but not all, of the M resistors, and a common line that electrically connects the M-th resistors of the plurality of resistor groups, and a driver circuit including a plurality of drivers respectively corresponding to the plurality of resistor groups, each driver supplying an amplified signal, obtained by amplifying the input signal, to the corresponding one of the plurality of resistor groups.

According to an aspect of the invention, a manufacturing method of a semiconductor device that includes a plurality of resistor groups, each having first to M-th resistors connected in series, M being an integer of 2 or greater, and at least one short-circuit line, each short-circuiting at least one, but not all, of the M resistors, and a common line that electrically connects the M-th resistors of the plurality of resistor groups, the method including, obtaining target information indicating the at least one resistor for each short-circuit line in each resistor group, and manufacturing the semiconductor device based on the target information.

According to an aspect of the invention, an output buffer for receiving an input signal and outputting an output signal through an external terminal, including an output resistor circuit including first to n-th resistor circuits, and a common line that electrically connects one end of each of the first to n-th resistor circuits to the external terminal, n being an integer of 2 or greater, first to n-th three-state drivers respectively supplying first to n-th amplified signals, which are obtained by amplifying the input signal, to the first to n-th resistor circuits, each at the other end thereof, and an output impedance adjusting circuit configured to supply first to n-th enable-disable signals to the first to n-th three-state drivers, respectively, to thereby enable or disable the first to n-th three-state drivers.

In the present invention, in a resistor array including a plurality of series resistor groups each of which includes a plurality of resistors connected in series, the respective resistors of each of the series resistor groups, except for at least one resistor, are short-circuited at the respective ends by a conductive line, or a resistor group that does not include at least one resistor is short-circuited at the respective ends by a conductive line so that the resistance of the resistor array can be adjusted to a desired resistance. In the present invention, in an output buffer that includes an output resistor circuit constituted of the first to n-th resistors, and the first to n-th three-state drivers that respectively supply the first to n-th amplified signals obtained by amplifying an input signal to the first to n-th resistors, the first to n-th three-state drivers is either enabled or disabled independently of each other, so that the resistance of the output resistor circuit can be adjusted.

Thus, even if an actual resistance of the resistor array (output resistor circuit) immediately after manufacturing does not match the desired resistance, by changing the combination of the resistors that are enabled, among the plurality of resistors, it is possible to adjust the resistance of the resistor array (output resistor circuit) to the desired resistance. Furthermore, by increasing the number of resistors included in the resistor array (output resistor circuit) or decreasing the difference between the resistances of the respective resistors, the resolution in adjusting the resistance can be improved. Therefore, even a low resistance, which is for ensuring the impedance matching for the transmission line, for example, can be adjusted to a desired resistance with a high degree of accuracy.

DETAILED DESCRIPTION FOR THE INVENTION

Embodiment 1

Figure 1:
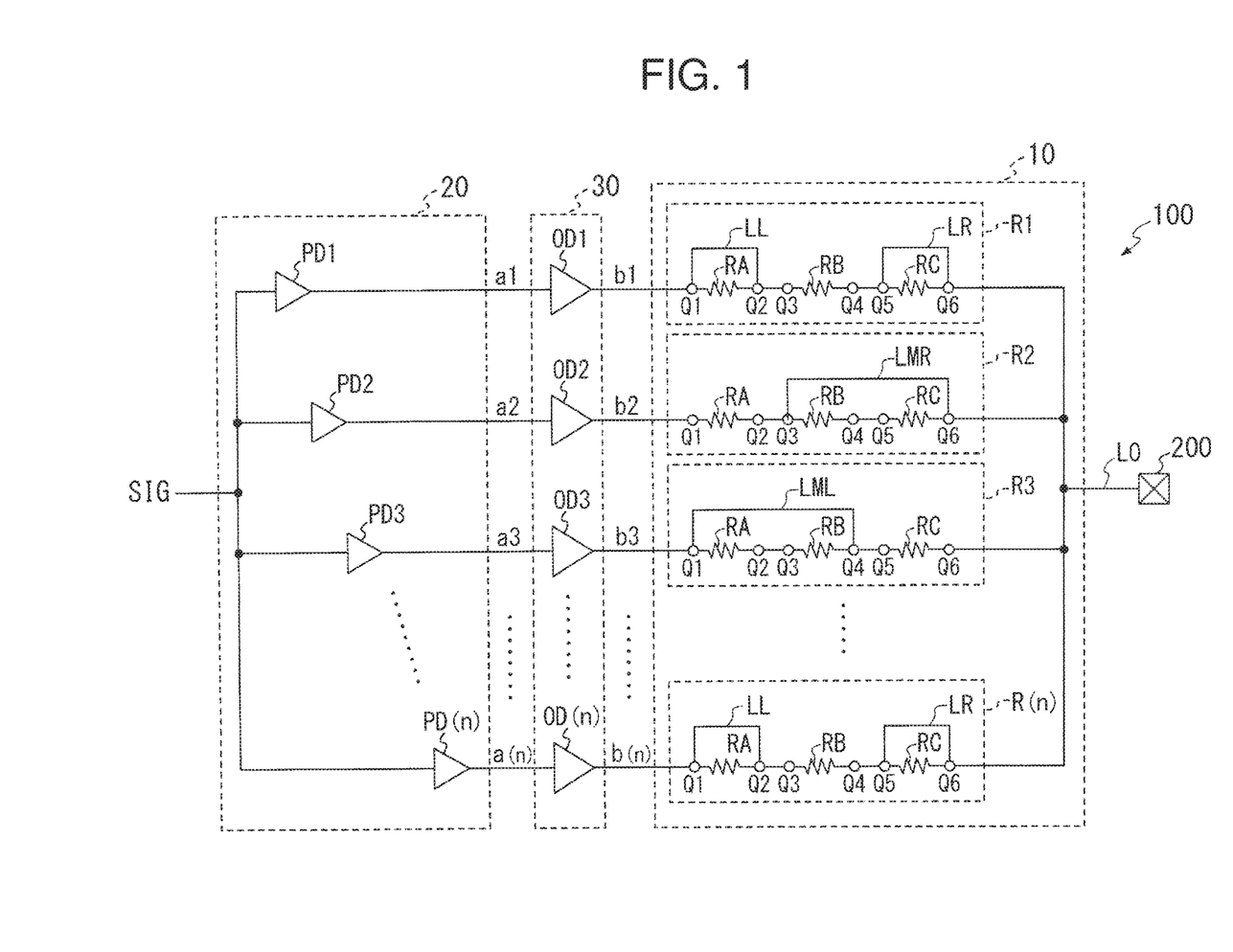
FIG. 1 is a circuit diagram showing an example of an output buffer 100 including an output resistor circuit 10, which is a resistor array of an exemplary embodiment.

FIG. 1 is a circuit diagram showing an example of an output buffer 100 including a resistor array of an exemplary embodiment. The output buffer 100 is formed in a semiconductor IC (integrated circuit), for example. The output buffer 100 is configured to amplify a signal SIG generated in an internal circuit formed in the semiconductor IC chip, and output the amplified signal via an output pad 200 of the semiconductor IC chip.

As shown in FIG. 1, the output buffer 100 includes an output resistor circuit 10, which is a resistor array, a pre-driver circuit 20, and an output driver circuit 30.

In the pre-driver circuit 20, the respective input terminals are connected to each other, and the pre-driver circuit 20 includes drivers PD1 to PD(n) (n is an integer of 2 or greater) that respectively receive a signal SIG via the input terminals. The drivers PD1 to PD(n) supply amplified signals a1 to a(n), which were obtained by respectively amplifying the signal SIG, to the output driver circuit 30.

The output driver circuit 30 includes drivers OD1 to OD(n) that respectively receive the amplified signals a1 to a(n). The drivers OD1 to OD(n) supply amplified signals b1 to b(n), which were obtained by amplifying the respective amplified signals a1 to a(n), to the output resistor circuit 10.

The output resistor circuit 10 includes series resistor groups R1 to R(n) each including a group of resistors made of resistors RA, RB, and RC connected to each other in series. The respective values of resistances of the resistors RA, RB and RC differ from each other. All of the resistors RA, RB, and RC have a resistance (resistance value) that is high enough to prevent electrostatic breakdown. The resistances of the resistors RA, RB, and RC have the following size relationship, for example.

RA>RB>RC

In each of the resistors RA of the series resistor groups R1 to R(n), one end Q1 thereof is supplied with one of amplified signals b1 to b(n), and the other end Q2 is connected to one end Q3 of the resistor RB. The other end Q4 of each resistor RB of the series resistor groups R1 to R(n) is connected to one end Q5 of a resistor RC. The other end Q6 of each resistor RC of the series resistor groups R1 to R(n) is commonly connected to the output pad 200 via a common line LO.

Each of the series resistor groups R1 to R(n) has one of three selection patterns, which are RA selection pattern, RB selection pattern, and RC selection pattern. In the RA selection pattern, only the resistor RA is enabled among the resistors RA, RB, and RC. In the RB selection pattern, only the resistor RB is enabled, and in the RC selection pattern, only the resistor RC is enabled.

In the embodiment shown in FIG. 1, the series resistor group R1 is formed to have the RB selection pattern, the series resistor group R2 is formed to have the RA selection pattern, and the series resistor group R3 is formed to have the RC selection pattern.

In the RA selection pattern, as shown with the series resistor group R2 in FIG. 1, for example, one end Q3 of the resistor RB and the other end Q6 of the resistor RC are short-circuited via a short-circuit line LMR. That is, in the RA selection pattern, among the resistors RA, RB, and RC, the respective ends of the resistor group (RB and RC) not including the resistor RA are short-circuited by the short-circuit line LMR. This way, the resistance of the resistor RA equals an actual resistance value (observed value) of the series resistor group R2 in the RA selection pattern.

In the RB selection pattern, as shown with the series resistor group R1 in FIG. 1, for example, one end Q1 and the other end Q2 of the resistor RA are short-circuited by a short-circuit line LL, and one end Q5 and the other end Q6 of the resistor RC are short-circuited by a short-circuit line LR. That is, in the RB selection pattern, among the resistors RA, RB, and RC, the respective ends of each resistor (RA and RC) other than the resistor RB are short-circuited by the short-circuit line LL or the short-circuit line LR. This way, the resistance of the resistor RB equals the actual resistance of the series resistor group R1 in the RB selection pattern.

In the RC selection pattern, as shown with the series resistor group R3 in FIG. 1, for example, one end Q1 of the resistor RA and the other end Q4 of the resistor RB are short-circuited by a short-circuit line LML. That is, in the RC selection pattern, among the resistors RA, RB, and RC, the respective ends of the resistor group (RA and RB) not including the resistor RC are short-circuited by the short-circuit line LML. This way, the resistance of the resistor RC equals the actual resistance of the series resistor group R3 in the RC selection pattern.

Figure 2A:
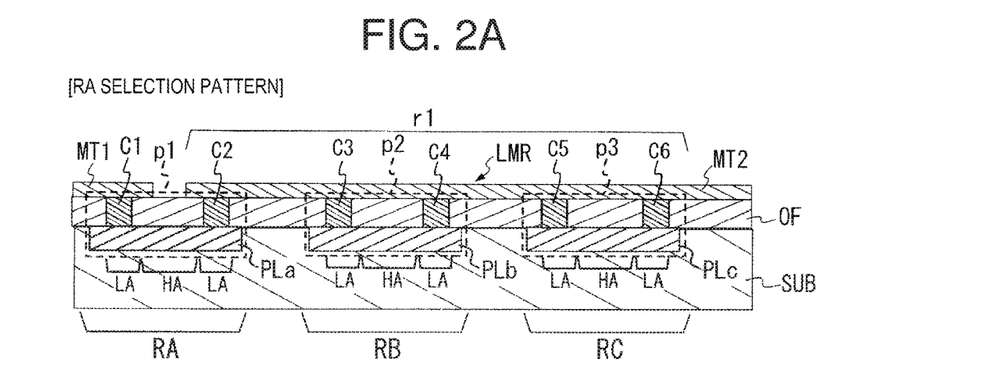
FIGS. 2A-2C are cross-sectional views showing a cross section of a series resistor group of each of RA selection pattern, RB selection pattern, and RC selection pattern, respectively.
Figure 2B:
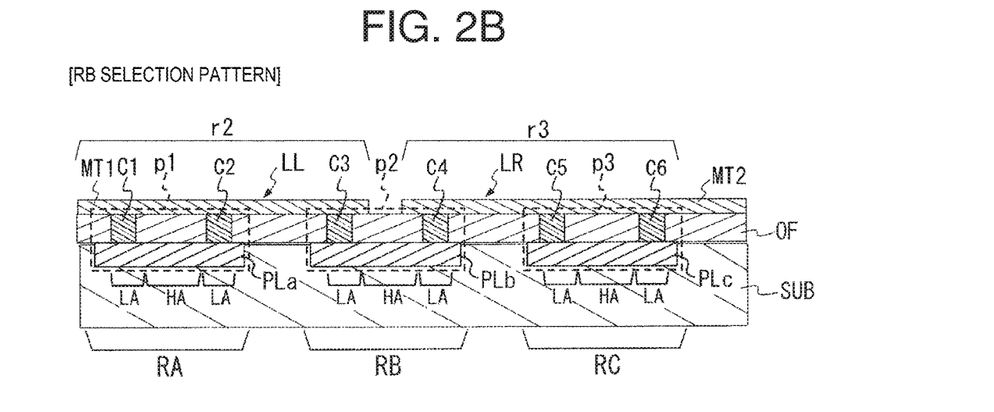
Figure 2C:
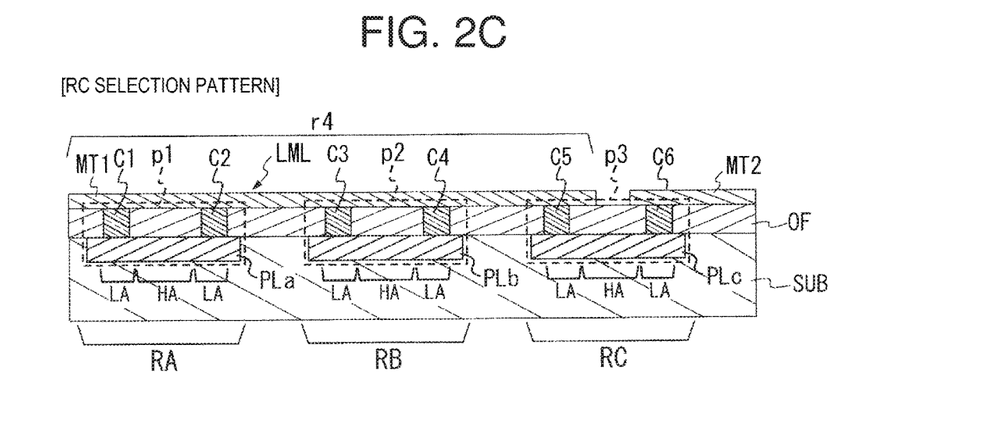

FIGS. 2A-2C are cross-sectional views showing a cross section of one of the series resistor groups R1 to R(n) of the RA selection pattern, RB selection pattern, and RC selection pattern, respectively. As shown in FIGS. 2A-2C, in any of the RA selection pattern, RB selection pattern, and RC selection pattern, each of the series resistor groups R1 to R(n) includes polysilicon resistance regions PLa, PLb, and PLc arranged separately from each other on the surface of a semiconductor substrate SUB, an insulating layer OF, contact holes C1 to C6, and metal layers MT1 and MT2.

The insulating layer OF is made of $SiO_2$, for example, and is formed so as to cover the surface of the semiconductor substrate SUB, and the respective surfaces of the polysilicon resistance regions PLa, PLb, and PLc. The contact holes C1 to C6 of each series resistor group are formed through the insulating layer OF from one surface to the other surface thereof. The respective contact holes C1 to C6 are filled with the same material as the metal layer MT1 (MT2) made of a conductive material such as aluminum, for example. The contact hole C1 is formed on one end of the polysilicon resistance region PLa, and the contact hole C2 is formed on the other end of the polysilicon resistance region PLa. The contact hole C3 is formed on one end of the polysilicon resistance region PLb, and the contact hole C4 is formed on the other end of the polysilicon resistance region PLb. The contact hole C5 is formed on one end of the polysilicon resistance region PLc, and the contact hole C6 is formed on the other end of the polysilicon resistance region PLc.

As shown in FIGS. 2A-2C, in each series resistor group, a region p1 indicated with the broken line encircling the polysilicon resistance region PLa and the contact holes C1 and C2 is the resistor RA shown in FIG. 1, and a region p2 indicated with the broken line encircling the polysilicon resistance region PLb and the contact holes C3 and C4 is the resistor RB. Also, in FIGS. 2A-2C, a region p3 indicated with the broken line encircling the polysilicon resistance region PLc and the contact holes C5 and C6 is the resistor RC shown in FIG. 1.

In each of the resistors RA, RB, and RC, as shown in FIGS. 2A-2C, each polysilicon resistance region (PLa, PLb, or PLc) includes a high resistance portion HA having a high resistance, and low resistance portions LA having a lower resistance than that of the high resistance portion HA. That is, as shown in FIGS. 2A-2C, in each polysilicon resistance region, the high resistance portion HA is formed in the center between the first contact hole (such as C1, C3, and C5) formed at one end and the second contact hole (such as C2, C4, and C6) formed at the other end, and the low resistance portion LA is formed in an area near each of the first and second contact holes. Thus, the resistance of each resistor (RA, RB, or RC) equals a resistance combining the resistance of the high resistance portion HA and the resistance of the pair of the low resistance portions LA.

As shown in FIGS. 2A-2C, in the RA selection pattern, the metal layer MT1 is formed so as to cover the opening of the contact hole C1 and the surface of the insulating layer OF. Furthermore, in the RA selection pattern, the metal layer MT2 is formed so as to cover the openings of the contact holes C2 to C6 and the surface of the insulating layer OF across a region r1 including the contact holes C2 to C6. In the RA selection pattern, the metal layer MT2 functions as the short-circuit line LMR shown in FIG. 1.

In the RB selection pattern, as shown in FIGS. 2A-2C, the metal layer MT1 is formed so as to cover the openings of the contact holes C1 to C3 and the surface of the insulating layer OF across a region r2 including the contact holes C1 to C3. Furthermore, in the RB selection pattern, the metal layer MT2 is formed so as to cover the openings of the contact holes C4 to C6 and the surface of the insulating layer OF across a region r3 including the contact holes C4 to C6. In the RB selection pattern, the metal layer MT1 functions as the short-circuit line LL shown in FIG. 1, and the metal layer MT2 functions as the short-circuit line LR shown in FIG. 1.

In the RC selection pattern, the metal layer MT1 is formed so as to cover the openings of the contact holes C1 to C5 and the surface of the insulating layer OF across a region r4 including the contact holes C1 to C5. Furthermore, in the RC selection pattern, the metal layer MT2 is formed so as to cover the opening of the contact hole C6 and the surface of the insulating layer OF. That is, in the RC selection pattern, the metal layer MT1 functions as the short-circuit line LML shown in FIG. 1.

In the embodiment described above, the number of resistors connected in series in each of the series resistor groups R1 to R(n) is 3 (resistors RA, RB and RC), but the present invention is not limited to this as long as there are at least two resistors.

That is, the output resistor circuit 10 as the resistor array needs to include the first to n-th (n is an integer of 2 or greater) series resistor groups (R1 to R(n)) each including the first to M-th (M is an integer of 2 or greater) resistors (RA, RB, and RC), and the common line and short-circuit lines described below. In other words, the respective one ends of the M-th resistance (RC) of the first to n-th series resistor groups are connected to each other via the common line (LO), and in each of the first to n-th series resistor groups, the respective ends of each resistor among the first to M-th resistors except for at least one resistor or the respective ends of the resistor group except for at least one resistor are short-circuited by the short-circuit lines (LL, LR, LMR, and LML).

Below, the manufacturing method of a semiconductor IC chip including the output buffer 100 of FIGS. 1 and 2 will be explained with reference to the schematic manufacturing flow shown in FIG. 3.

First, semiconductor manufacturing equipment (not shown in the figure) manufactures a tester chip A, which is a semiconductor IC chip in which the series resistor groups R1 to R(n) of the output resistor circuit 10 in the output buffer 100 are all formed to have the RA selection pattern shown in FIG. 2A (Step S1). Next, the semiconductor manufacturing equipment manufactures a tester chip B, which is a semiconductor IC chip in which the series resistor groups R1 to R(n) of the output resistor circuit 10 are all formed to have the RB selection pattern shown in FIG. 2B (Step S2). Next, the semiconductor manufacturing equipment manufactures a tester chip C, which is a semiconductor IC chip in which the series resistor groups R1 to R(n) of the output resistor circuit 10 are all formed to have the RC selection pattern shown in FIG. 2C (Step S3).

After manufacturing the tester chips A to C through Steps S1 to S3 described above, the tester chip A is connected to a tester (not shown in the figure) first.

The tester measures the resistance of the output resistor circuit 10 of the tester chip A as the actual resistance XRA (Step S4). For example, in Step S4, the tester supplies amplified signals b1 to b(n) each having the voltage value corresponding to the logical level 1 (or 0) to the output resistor circuit 10 via the output driver 30, and takes in the voltage value of the output pad 200 at the same time. In the tester chip A, all of the series resistance groups R1 to R(n) are formed in the RA selection pattern, and therefore, the output resistor circuit 10 of the tester chip A is equivalent to a circuit made of n-number of resistors RA connected in parallel among the resistors RA, RB and RC. Thus, in Step S4, the tester calculates the actual resistance XRA of the output resistor circuit 10, which is the combined resistance of a circuit made of n-number of the resistors RA connected in parallel, based on the voltage value of the output pad 200 taken in as described above and the voltage value corresponding to the logical level 1 (or 0).

Next, the tester chip B is connected to the tester. The tester measures the resistance of the output resistor circuit 10 of the tester chip B as the actual resistance XRB (Step S5). For example, in Step S5, the tester supplies amplified signals b1 to b(n) each having the voltage value corresponding to the logical level 1 (or 0) to the output resistor circuit 10 via the output driver 30, and takes in the voltage value of the output pad 200 at the same time. In the tester chip B, all of the series resistance groups R1 to R(n) are formed in the RB selection pattern, and therefore, the output resistor circuit 10 of the tester chip B is equivalent to a circuit made of n-number of resistors RB connected in parallel among the resistors RA, RB and RC. Thus, in Step S5, the tester calculates the actual resistance XRB of the output resistor circuit 10, which is the combined resistance of a circuit made of n-number of the resistors RB connected in parallel, based on the voltage value of the output pad 200 taken in as described above and the voltage value corresponding to the logical level 1 (or 0).

Next, the tester chip C is connected to the tester. The tester measures the resistance of the output resistor circuit 10 of the tester chip C as the actual resistance XRC (Step S6). For example, in Step S6, the tester supplies amplified signals b1 to b(n) each having the voltage value corresponding to the logical level 1 (or 0) to the output resistor circuit 10 via the output driver 30, and takes in the voltage value of the output pad 200 at the same time. In the tester chip C, all of the series resistance groups R1 to R(n) are formed in the RC selection pattern, and therefore, the output resistor circuit 10 of the tester chip C is equivalent to a circuit made of n-number of resistors RC connected in parallel among the resistors RA, RB and RC. Thus, in Step S6, the tester calculates the actual resistance XRC of the output resistor circuit 10, which is the combined resistance of a circuit made of n-number of the resistors RC connected in parallel, based on the voltage value of the output pad 200 taken in as described above and the voltage value corresponding to the logical level 1 (or 0).

Next, the tester generates manufacturing resistor selection information indicating a resistor selection pattern to match the combined resistance of the series resistor groups R1 to R(n) with a desired resistance, based on the actual resistances XRA, XRB, and XRC (Step S7). The desired resistance is a resistance required as the resistance of the output resistor circuit 10, and the resistor selection pattern is a pattern indicating which one of the RA selection pattern, RB selection pattern, and RC selection pattern needs to be applied to each of the series resistor groups R1 to R(n). That is, the manufacturing resistor selection information specifies one of the resistors RA, RB and RC, which are connected with each other in series, as a resistor to be enabled for each of the series resistor groups R1 to R(n).

Figure 4:
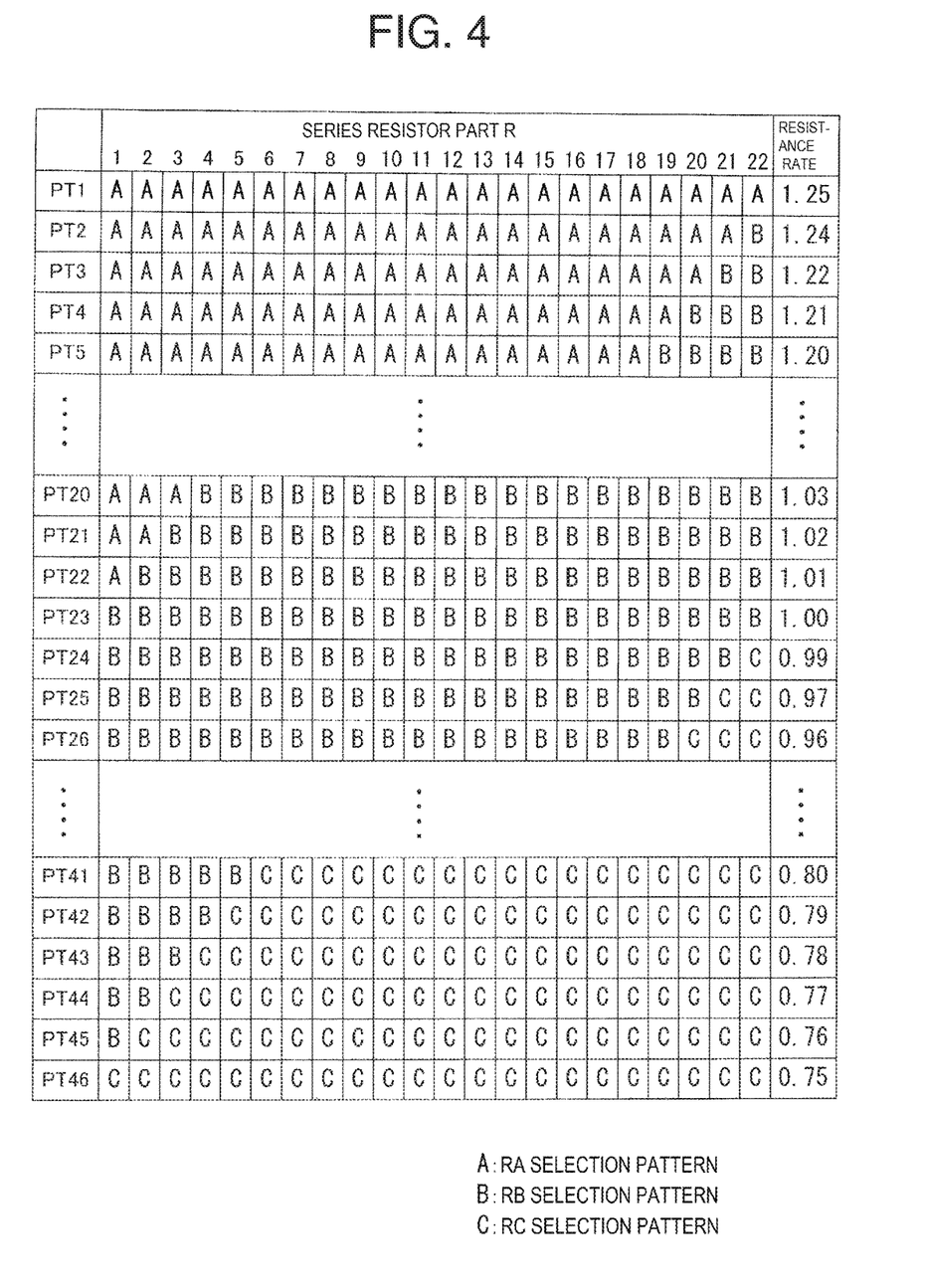
FIG. 4 is a diagram showing an example of resistor selection patterns PT1 to PT46 for series resistor groups R1 to R22 and a resistance ratio of each resistor selection pattern.

For example, in Step S7, the tester first calculates the maximum resistance rate that is the ratio of the actual resistance XRA to the actual resistance XRB, which is the middle resistance among the actual resistances XRA, XRB, and XRC and is defined as 1 (will be referred to as "resistance rate" below). The tester also calculates the minimum resistance rate that is the resistance rate of the actual resistance XRC. The tester selects resistor selection patterns having different combined resistances from 3 to the n-th power of the resistor selection patterns that are obtained from the fact that each of the series resistance groups R1 to R(n) has one of the RA selection pattern, RB selection pattern, and RC selection pattern. For example, if the number "n" of the series resistance groups R1 to R(n) is 22, there would be 3 to the 22-th power of the resistor selection patterns for the series resistor groups R1 to R22, and the tester selects the resistor selection patterns PT1 to PT46 shown in FIG. 4 as the representative resistor selection patterns having different combined resistances. Then, the tester calculates the resistance rate corresponding to the combined resistance of each of the resistor selection pattern selected in the manner described above, based on the calculated maximum resistance rate and the minimum resistance rate, and assigns those rates to the respective resistor selection patterns. For example, if the resistance rate of the actual resistance XRA (maximum resistance rate) is "1.25," the tester assigns the resistance rate "1.25" to the resistor selection pattern resulting in the greatest combined resistance, or in other words, as shown in FIG. 4, the resistor selection pattern PT1 in which all of the series resistor groups R1 to R22 have the RA selection pattern. If the resistance rate of the actual resistance XRC (minimum resistance rate) is "0.75," the tester assigns the resistance rate "0.75" to the resistor selection pattern resulting in the smallest combined resistance, or in other words, as shown in FIG. 4, the resistor selection pattern PT46 in which all of the series resistor groups R1 to R22 have the RC selection pattern. Among the series resistor groups R1 to R22, the greater the number of the series resistor groups having the RA selection pattern is, the higher the combined resistance gets, and the greater the number of the series resistor groups having the RC selection pattern is, the lower the combined resistance gets. Thus, the tester assigns, to each of the resistor selection patterns PT2 to PT45, a resistance rate corresponding to the combined resistance of each of the resistor selection patterns PT2 to PT45, based on the minimum resistance rate "0.75," and the maximum resistance rate "1.25" as shown in FIG. 4. Next, the tester calculates an actual resistance rate by dividing the desired resistance required as the resistance of the output resistor circuit 10 by the actual resistance XRB, and selects a resistor selection pattern that has the same resistance rate as or closest resistance rate to the actual resistance rate from the group of resistor selection patterns described above, or in other words, the resistor selection patterns PT1 to PT46. The tester then generates information indicated by the selected resistor selection pattern, or in other words, manufacturing resistor selection information that specifies one resistor to be enabled out of the resistors RA, RB, and RC for each of the series resistor groups R1 to R(n). For example, if the actual resistance rate is "1.21," the tester selects PT4 from the resistor selection patterns PT1 to PT46 shown in FIG. 4. As shown in FIG. 4, in the resistor selection pattern PT4, each of the series resistor groups R1 to R19 is formed in the RA selection pattern, and each of the series resistor groups R20 to R22 are in the RB selection pattern. Thus, the tester generates the manufacturing resistor selection information that specifies RA out of the resistors RA, RB, and RC as a resistor to be enabled in the respective series resistor groups R1 to R19, and specifies the resistor RB as a resistor to be enabled in the respective series resistor groups R20 to R22.

After the manufacturing resistor selection information is generated in Step S7 described above, the semiconductor manufacturing equipment manufactures a semiconductor device for shipping that is a semiconductor IC chip including the output resistor circuit 10 in which the short-circuit lines (LL, LR, LMR, and LML) are formed in the respective series resistor groups R1 to R(n) in accordance with the manufacturing resistor selection information (Step S8).

Figure 3:
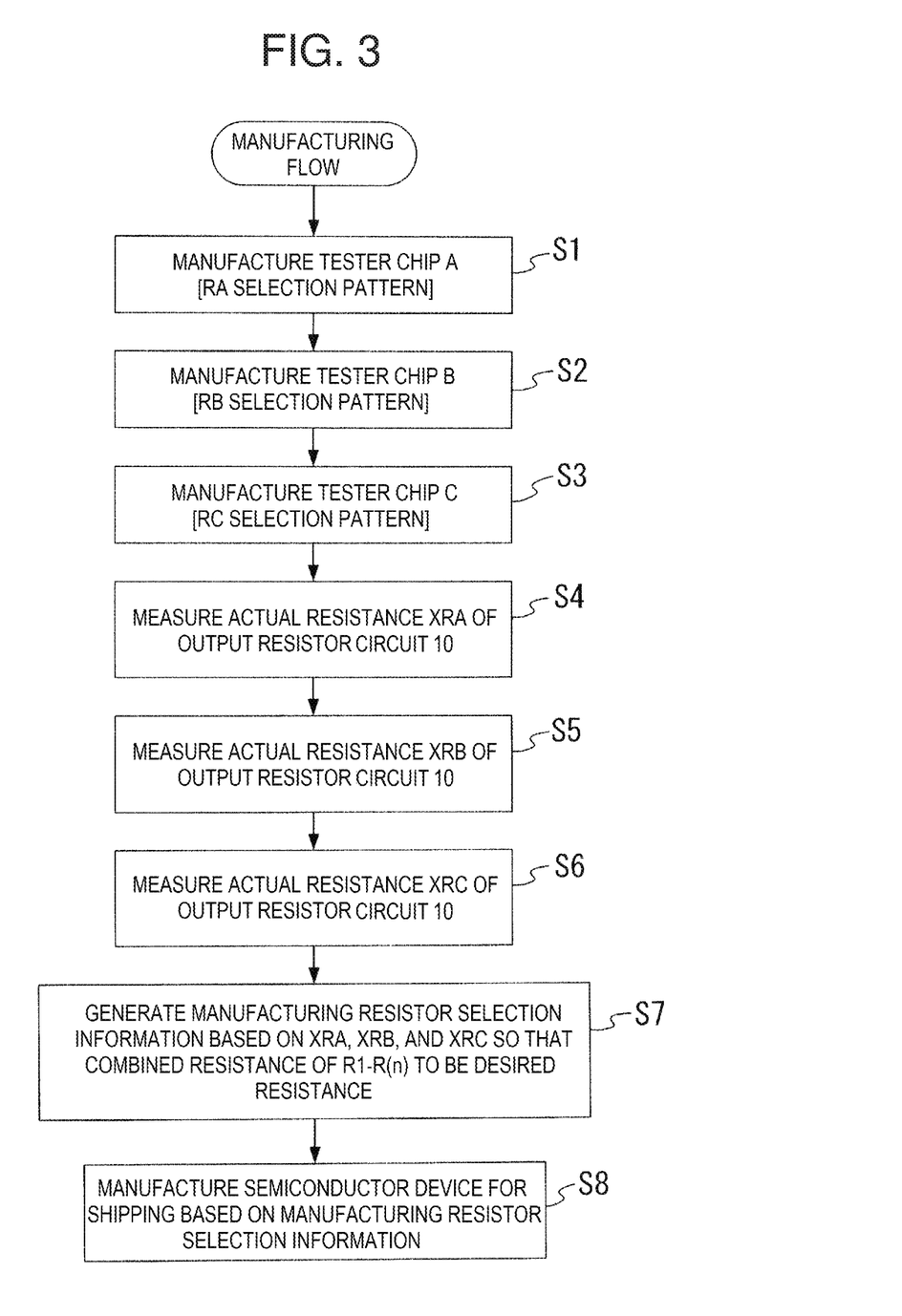
FIG. 3 is a flowchart schematically showing a manufacturing method of a semiconductor IC chip including the output buffer 100.

In the manufacturing flow shown in FIG. 3, the actual resistances XRA, XRB, and XRC corresponding to the resistors RA, RB, and RC are obtained by manufacturing three tester chips A, B, and C and measuring the actual resistances of the respective output resistor circuits 10. However, it is also possible to manufacture only two tester chips among the tester chips A to C (for example, the tester chips A and B), obtain the actual resistances (for example, XRA and XRB) of the two resistors (for example, the resistors RA and RB) by measuring the resistances of the respective output resistor circuits 10, and calculate the actual resistance of the remaining one resistor (for example, resistance RC) based on the measured resistances. In the embodiment above, each tester chip A, B, or C is configured such that the series resistor groups R1 to R(n) have the same resistor selection pattern, but it is also possible to combine two or three resistor selection patterns in one series resistor group.

That is, in the exemplary embodiment, a semiconductor IC chip including an output resistor circuit 10 (resistor array) whose resistance has been adjusted through the first manufacturing process, resistance measurement process, resistor selection information generating process, and second manufacturing process is manufactured as a semiconductor device for shipping. First, in the first manufacturing process (S1 to S3), tester semiconductor devices each of which is a semiconductor device equipped with a resistor array (10) including: first to n-th series resistor groups (R1 to R(n)) each made of first to M-th resistors (RA, RB, and RC); a common line (LO) that connects respective one ends of the M-th resistors (RC) of the first to n-th series resistor groups to each other; and short-circuit lines (LL, LR, LMR, LML) that short-circuit respective ends of each resistor or respective ends of a resistor group of the first to M-th resistors except for prescribed one resistor in each of the first to n-th series resistor groups is manufactured. Next, in the resistance measurement process (S4 to S6), the resistances of the resistor arrays (10) formed in the tester semiconductor devices are measured as the actual resistances (XRA, XRB, and XRC). Next, in the resistor selection information generating process (S7), the manufacturing resistor selection information is generated to specify one of the first to M-th resistors as a resistor to be enabled for each of the first to n-th series resistor groups based on the actual resistances. In the second manufacturing process (S8), a semiconductor device for shipping that is a semiconductor IC chip equipped with a resistor array including: first to n-th series resistor groups each made of first to M-th resistors; a common line that connects respective one ends of the M-th resistors of the first to n-th series resistor groups to each other; and short-circuit lines (LL, LR, LMR, LML) that short-circuit respective ends of each resistor or respective ends of the resistor group except for the one resistor specified by the manufacturing resistor selection information in each of the first to n-th series resistor groups.

Thus, with the output resistor circuit 10 as the resistor array, and the manufacturing method shown in FIG. 3, it is possible to manufacture a semiconductor device for shipping that includes the output buffer 100 in which the resistance of the output resistor circuit 10 has been adjusted to a desired resistance. With this output resistor circuit 10 and the manufacturing method of FIG. 3, by increasing the number (n) of the series resistor groups included in the output resistor circuit 10, decreasing the number (M) of the resistors constituting each series resistor group, or reducing the difference between the resistances of the respective resistors, the resolution in adjusting the resistance can be improved. Therefore, even a low resistance for the impedance matching of the transmission line, for example, can be adjusted to a desired resistance with a high degree of accuracy. Also, the tester semiconductor device differs from the semiconductor device for shipping only in the metal wiring lines MT1 or MT2 in the output resistor circuit 10. This means that the mask pattern for manufacturing the semiconductor device for shipping is the same as the mask pattern for manufacturing the tester semiconductor device except for the portion thereof used to form the metal wiring lines MT1 to MT2. Therefore, it is possible to reduce an increase in manufacturing cost caused by making a change to the mask pattern in order to manufacture semiconductor devices for shipping with adjusted resistance after manufacturing the tester semiconductor devices.

Embodiment 2

Figure 5:
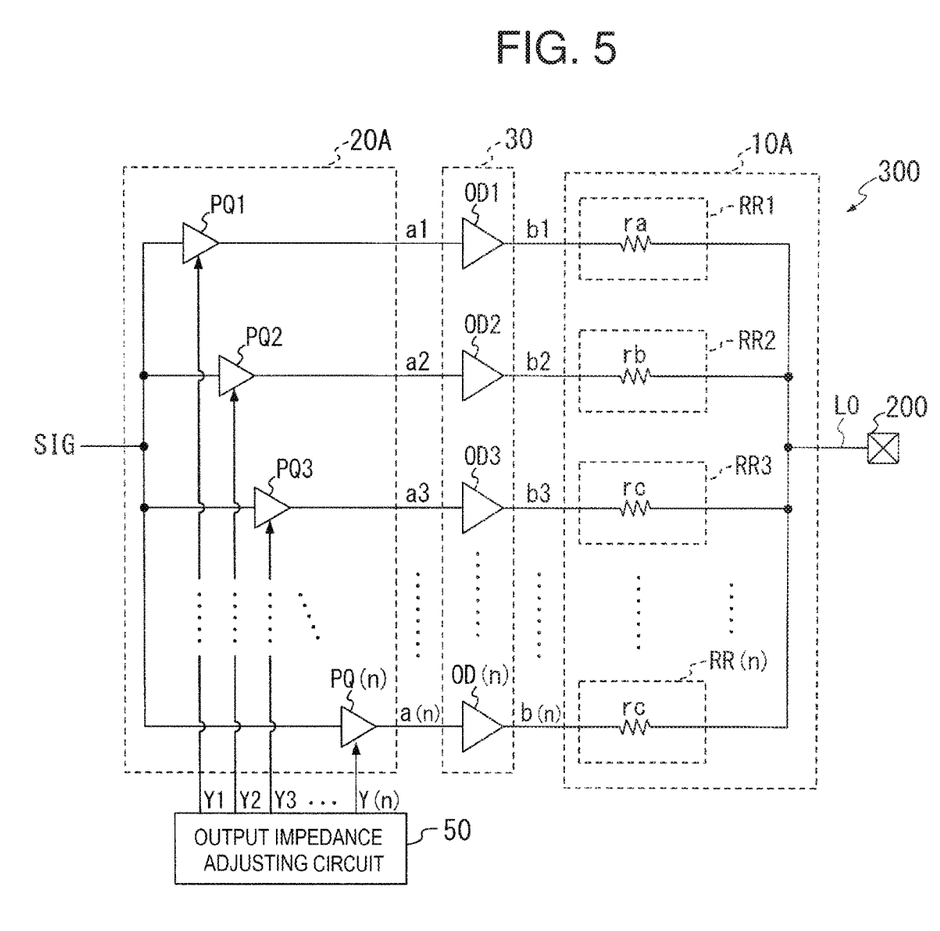
FIG. 5 is a circuit diagram showing an output buffer 300 of an exemplary embodiment.

FIG. 5 is a circuit diagram showing an output buffer 300 of the exemplary embodiment. In a manner similar to the output buffer 100 shown in FIG. 1, the output buffer 300 is formed in a semiconductor IC chip, and is configured to receive a signal SIG generated in a circuit formed in the semiconductor IC chip and output the signal SIG through the output pad 200.

The output buffer 300 includes an output resistor circuit 10A made of a resistor array, a pre-driver circuit 20A, an output driver circuit 30, and an output impedance adjusting circuit 50.

In the pre-driver circuit 20A, the respective input terminals are connected to each other, and the pre-driver circuit 20 includes three-state drivers PQ1 to PQ(n) (n is an integer of 2 or greater) that respectively receive a signal SIG via the input terminals. The drivers PQ1 to PQ(n) are supplied with corresponding enable signals Y1 to Y(n) respectively. If the supplied enable signal Y indicates the logical level 0, for example, the driver PQ is disabled, and the output terminal thereof is set to the high impedance state. If the supplied enable signal Y indicates the logical level 1, for example, each driver PQ1 to PQ(n) is enabled, and outputs the signal obtained by amplifying the signal SIG via the output terminal thereof. The drivers PQ1 to PQ(n) supply the amplified signals a1 to a(n) indicating the voltage values of the respective output terminals to the output driver circuit 30.

The output driver circuit 30 includes drivers OD1 to OD(n) that respectively receive the amplified signals a1 to a(n). The drivers OD1 to OD(n) supply amplified signals b1 to b(n), which were obtained by amplifying the respective amplified signals a1 to a(n), to the output resistor circuit 10A.

The output resistor circuit 10A include resistors RR1 to RR(n) that receive the amplified signals b1 to b(n) at the respective one ends thereof. The other end of each resistor RR1 to RR(n) is commonly connected to the output pad 200 via a common line LO. The resistances of the respective resistors RR1 to RR(n) may be the same as each other or different from each other as long as the resistances are large enough to prevent electrostatic breakdown.

The output impedance adjusting circuit 50 supplies, to the drivers PQ1 to PQ(n), respectively, the binary (logical level 0 or 1) enable signals Y1 to Y(n) that enable or disable the drivers PQ1 to PQ(n) independently of each other.

As described above, the output buffer 300 of FIG. 5 includes the output resistor circuit described below, the first to n-th three-state drivers, and the output impedance adjusting circuit. That is, the output resistor circuit (10A) includes the first to n-th resistors (RR1 to RR(n)), and the common line (LO) that connects the respective one ends of the first to n-th resistors to the external terminal (200). The first to n-th three-state drivers (PQ1 to PQ(n)) are provided respectively for the first to n-th resistors, and supplies the first to n-th amplified signals (a1 to a(n)) obtained by respectively amplifying the input signal (SIG) to the other end of each of the first to n-th resistors. The output impedance adjusting circuit (50) is configured to supply the first to n-th enable signals (enable-disable signals) (Y1 to Y(n)) to the first to n-th three-state drivers to enable or disable the first to n-th three-state drivers independently of each other.

Below, the method for adjusting the output impedance of the output buffer 300 shown in FIG. 5 will be explained.

In the initial state before shipping, the output impedance adjusting circuit 50 supplies, to the driver PQ1 to PQ(n), the enable signals Y1 to Y(n) that enable each driver PQ specified in advance among the drivers PQ1 to PQ(n), and disable the other drivers. Thus, in the initial state, the resistor RR connected in series to the disabled driver PQ is disabled, and the resistor RR connected in series to the enabled driver PQ is enabled, among the driver PQ1 to PQ(n). This way, the resistance of the output resistor circuit 10A equals the combined resistances of the respective resistors RR connected in series to the enabled drivers PQ. Therefore, if the drivers PQ1 to PQ5 among the drivers PQ1 to PQ(n) are enabled, and the other drivers PQ6 to PQ(n) are disabled, the resistance of the output resistor circuit 10A equals to the combined resistance of the resistors RR1 to RR5.

Next, the tester obtains the actual resistance by measuring the resistance of the output resistor circuit 10A of the semiconductor IC chip including the output impedance adjusting circuit 50 in this initial state in a manner similar to Step S5 of FIG. 3.

If the actual resistance is lower than the desired resistance required as the resistance of the resistance of the output resistor circuit 10A, the tester selects a group of resistors RR that results in a combined resistance higher than the actual resistance by a difference between the desired resistance and the actual resistance among the resistors RR1 to RR(n). If the actual resistance is higher than the desired resistance, the tester selects a group of resistors RR that results in a combined resistance lower than the actual resistance by a difference between the desired resistance and the actual resistance among the resistors RR1 to RR(n).

Thereafter, the tester configures the output impedance adjusting circuit 50 so as to generate enable signals Y1 to Y(n) that keep the respective resistors RR belonging to the selected group enabled, and the rest of the resistors RR disabled even after the power is shut off. That is, the resistance of the output resistor circuit 10A is adjusted to a desired resistance by the output impedance adjusting circuit 50 setting the number of resistors RR to be enabled and the combination of the resistors RR to be enabled among the resistors RR1 to RR(n) of the output resistor circuit 10A.

Thereafter, the semiconductor IC chip having the output buffer 300 subjected to the above-described adjustment is shipped as a final product.

Thus, with the output buffer 300 shown in FIG. 5, even if the actual resistance of the output resistor circuit 10A immediately after manufacturing does not match the desired resistance, by changing the combination of the resistors that are enabled, among the plurality of resistors, it is possible to adjust the resistance to the desired resistance. Furthermore, by increasing the number of resistors included in the output resistor circuit 10A and decreasing the difference between the resistances of the respective resistors, the resolution in adjusting the resistance can be improved. Therefore, even a low resistance, which is for ensuring impedance matching for the transmission line, for example, can be adjusted to a desired resistance with a high degree of accuracy.

What is claimed is:

1. A resistor array made of a semiconductor, comprising:
    a plurality of resistor groups in a semiconductor substrate, each including
        first to M-th resistors connected in series by a metal layer formed on the semiconductor substrate, M being an integer of 2 or greater, and
        at least one short-circuit line made up of the metal layer, each short-circuiting at least one, but not all, of the M resistors by connecting terminals of the at least one of the M resistors by the metal layer; and
    a common line that electrically connects the M-th resistors of the plurality of resistor groups.

2. The resistor array according to claim 1, wherein the at least one short-circuit line includes a plurality of short-circuit lines.

3. The resistor array according to claim 1, wherein the resistors in each resistor group have resistance values different from one other.

4. A manufacturing method of a semiconductor device comprising a plurality of resistor groups, each resistor group including first to M-th resistors connected in series, M being an integer of 2 or greater, and at least one short-circuit line, each short-circuiting at least one, but not all, of the M resistors, the semiconductor device further comprising a common line that electrically connects the M-th resistors of the plurality of resistor groups, the method comprising:
    obtaining target information indicating the at least one resistor for each short-circuit line in each resistor group; and
    manufacturing the semiconductor device based on the target information.

5. The manufacturing method of a semiconductor device according to claim 4, wherein the obtaining target information includes:
    manufacturing a tester semiconductor device including
        a plurality of tester resistor groups respectively corresponding to the plurality of resistor groups of the semiconductor device, each tester resistor group including
            first to M-th tester resistors connected in series that respectively correspond to the first to M-th resistors of the corresponding resistor group of the semiconductor device, and
            at least one short-circuit line, each short-circuiting at least one, but not all, of the M tester resistors, and
        a common line that electrically connects the M-th tester resistors of the plurality of tester resistor groups,
    measuring a resistance value of at least one test resister of the plurality of tester resistor groups, and
    generating the target information using the measured resistance value.

6. The manufacturing method of a semiconductor device according to claim 5, wherein
    the obtaining target information further includes calculating a resistance value of another resistor of the plurality of tester resistor groups, using the measured resistance value, and
    the target information is generated using the measured resistance value and the calculated resistance value.

7. The manufacturing method of a semiconductor device according to claim 4, wherein the resistors in each resistor group are manufactured to have resistance values different from one other.

8. An output buffer for receiving an input signal and outputting an output signal through an external terminal, comprising:
    an output resistor circuit including
        a plurality of resistor groups formed in a substrate, each including
            first to M-th resistors connected in series by a metal layer, M being an integer of 2 or greater, and
            at least one short-circuit line made of the metal layer, each short-circuiting at least one, but not all, of the M resistors by connecting terminals of the at least one of the M resistors by the metal layer; and
        a common line that electrically connects the M-th resistors of the plurality of resistor groups; and
    a driver circuit including a plurality of drivers respectively corresponding to the plurality of resistor groups, each driver supplying an amplified signal, obtained by amplifying the input signal, to the corresponding one of the plurality of resistor groups.

9. The output buffer according to claim 8, wherein the at least one short-circuit line includes a plurality of short-circuit lines.

10. The output buffer according to claim 8, wherein the M resistors in each resistor group have resistance values different from one other.

11. An output buffer for receiving an input signal and outputting an output signal through an external terminal, comprising:
- an output resistor circuit including first to n-th resistor circuits, and a common line that electrically connects one end of each of the first to n-th resistor circuits to the external terminal, n being an integer of 2 or greater;
- first to n-th three-state drivers respectively supplying first to n-th amplified signals, which are obtained by amplifying the input signal, to the first to n-th resistor circuits, each at the other end thereof; and
- an output impedance adjusting circuit configured to supply first to n-th enable-disable signals to the first to n-th three-state drivers, respectively, to thereby enable or disable the first to n-th three-state drivers.

12. The resistor array of claim 1, wherein the plurality of resistor groups comprises at least one first resistor group having a first short-circuit line short-circuiting only one resistor in the first resistor group, and at least one second resistor group having a second short-circuit line short-circuiting at least two of the M resistors of the second resistor group.

* * * * *